US009042151B2

(12) United States Patent
Annunziata et al.

(10) Patent No.: US 9,042,151 B2
(45) Date of Patent: May 26, 2015

(54) RACETRACK MEMORY WITH ELECTRIC-FIELD ASSISTED DOMAIN WALL INJECTION FOR LOW-POWER WRITE OPERATION

(71) Applicant: International Business Machines Corporation, Armonk, NY (US)

(72) Inventors: Anthony J. Annunziata, Stamford, CT (US); Marcin J. Gajek, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 13/835,254

(22) Filed: Mar. 15, 2013

(65) Prior Publication Data

US 2014/0268981 A1    Sep. 18, 2014

(51) Int. Cl.
*G11C 19/02*    (2006.01)
*G11C 19/08*    (2006.01)

(52) U.S. Cl.
CPC ............ *G11C 19/0808* (2013.01); *G11C 19/02* (2013.01); *G11C 19/0816* (2013.01); *G11C 19/0841* (2013.01)

(58) Field of Classification Search
CPC ........ G11C 11/15; G11C 11/16; G11C 19/02; G11C 19/0808; G11C 19/0816; G11C 19/0841
USPC .................................................. 365/158, 80
See application file for complete search history.

(56) References Cited

U.S. PATENT DOCUMENTS

| 6,829,157 | B2 | 12/2004 | Kim et al. | |
|---|---|---|---|---|
| 6,898,132 | B2 | 5/2005 | Parkin | |
| 7,236,386 | B2 | 6/2007 | Parkin | |
| 7,768,809 | B2 | 8/2010 | Trouilloud | |
| 8,138,758 | B2 | 3/2012 | Wunderlich et al. | |
| 8,450,818 | B2 | 5/2013 | Nikonov et al. | |
| 2010/0321993 | A1* | 12/2010 | Nikonov et al. | ............. 365/171 |
| 2013/0242647 | A1* | 9/2013 | Nakamura et al. | ............ 365/158 |

FOREIGN PATENT DOCUMENTS

WO        2011158208 A1    12/2011

OTHER PUBLICATIONS

D. Chiba, et al., "Electric-field control of magnetic domain-wall velocity in ultrathin cobalt with perpendicular Magnetization," Nature Communications, 3:888, Jun. 2012, pp. 1-7.
T. Maruyama, et al., "Large Voltage-induced Magnetic Anisotropy change in a few Atomic Layers of Iron," Nature Nanotechnology, vol. 4, Mar. 2009, pp. 158-161.

(Continued)

*Primary Examiner* — Hoai V Ho
*Assistant Examiner* — Tri Hoang
(74) *Attorney, Agent, or Firm* — Cantor Colburn LLP; Vazken Alexanian

(57) ABSTRACT

Embodiments are directed to injecting domain walls in a magnetic racetrack memory. In some embodiments, a racetrack comprising a nanowire is coupled with a gate in order to manipulate an anisotropy associated with the nanowire. The racetrack and gate is coupled with a pinning layer configured to establish a magnetization direction in the nanowire.

18 Claims, 4 Drawing Sheets

(56) References Cited

OTHER PUBLICATIONS

S.S.P. Parkin, et al., "Oscillations in Exchange Coupling and Magnetoresistance in Metallic Superlattice Structures: Co/Ru, Co/Cr, and Fe/Cr," Physical Review Letters, vol. 64, No. 19, May 7, 1990, pp. 1-5.

Ioan Tudosa, et al., "Perpendicular Spin-Torque Switching with a Synthetic Antiferromagnetic Reference Layer," Applied Physics Letters, 96, 212504, 2010, pp. 1-4.

Wei-Gang Wang, et al., "Electric-Field-Assisted Switching in Magnetic Tunnel Junctions," Nature Materials, vol. 11, Jan. 2012, pp. 64-68.

U. Bauer et al., "Electric field control of domain wall propagation in Pt/Co/GdOx films," Applied Physics Letters, vol. 100, Issue 19, 2012, 192408, 4 pages.

N. Lei et al., "Electric field control of domain wall logic in piezoelectric/ferromagnetic nanodevices," arXiv:1201,4939, 2012, 16 pages.

W. Lin et al., "Interfacial charge accumulation effect on magnetic domain wall nucleation and propagation in a Pt/Co/Pt/Al2O3 structure," arXiv:1201.5917, 2012, 4 pages.

A. J. Schellekens et al., "Electric-field control of domain wall motion in perpendicularly magnetized materials," Nature Communications, vol. 3, Article 847, May 22, 2012, 5 pages.

N. Tiercelin et al., "Magnetoelectric memory using orthogonal magnetization states and magnetoelastic switching," Journal of Applied Physics, vol. 109, 2011, 07D726, 3 pages.

\* cited by examiner

RACETRACK MEMORY WITH ELECTRIC-FIELD ASSISTED DOMAIN WALL INJECTION FOR LOW-POWER WRITE OPERATION

FIELD OF INVENTION

The present invention relates generally to computer memory technology, and more specifically, to an injection of a domain wall in a magnetic shift register memory.

DESCRIPTION OF RELATED ART

Magnetic shift register memories may make use of magnetic domains for purposes of storing data. Magnetic shift register memories require the injection of a domain wall along the length of a wire (e.g., a racetrack wire). Domain walls can be injected in a magnetic stripe via a local magnetic field at a location along the racetrack wire, or via current-induced spin-torque switching with a current injected from a reference layer via a metallic or insulating spacer at various locations along the wire. Both of these methods typically require large current densities and therefore are prone to large power dissipations.

BRIEF SUMMARY

Embodiments are directed to a method for injecting domain walls in a magnetic racetrack memory comprising: coupling a racetrack comprising a nanowire with a gate in order to manipulate an anisotropy associated with the nanowire, and coupling the racetrack and gate with a pinning layer configured to establish a magnetization direction in the nanowire.

Embodiments are directed to a magnetic domain wall shift register memory comprising: a magnetic nanowire, a dielectric layer configured to provide a surface anisotropy contribution to the nanowire, at least one antiferromagnet configured to induce an exchange bias locally on the nanowire, and a tunnel junction configured to provide a readout of a magnetic domain.

Embodiments are directed to a computer program product for injecting domain walls in a magnetic racetrack memory, the computer program product comprising a non-transitory computer readable storage medium having program code embodied therewith, the program code executable by a device to: couple a racetrack comprising a nanowire with a gate in order to manipulate an anisotropy associated with the nanowire, and couple the racetrack and gate with a pinning layer configured to establish a magnetization direction in the nanowire.

Additional features and advantages are realized through the techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages are apparent from the following detailed description taken in conjunction with the accompanying drawings in which:

DETAILED DESCRIPTION

Figure 1:
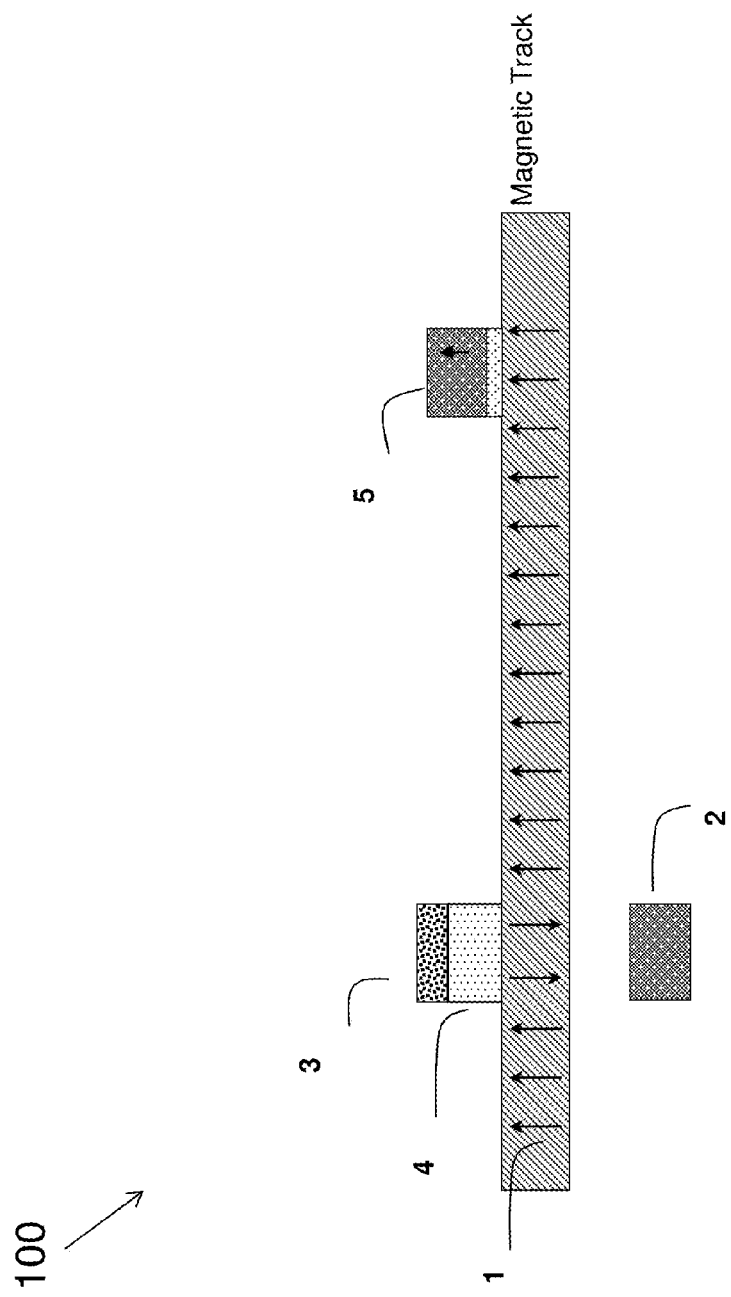
FIG. 1 is a schematic diagram for an exemplary magnetic domain wall shift register memory device.

It is noted that various connections are set forth between elements in the following description and in the drawings (the contents of which are included herein by way of reference). It is noted that these connections in general and, unless specified otherwise, may be direct or indirect and that this specification is not intended to be limiting in this respect. In this regard, a coupling of entities may refer to either a direct or an indirect connection.

Methods, apparatuses, and systems are described for injecting domain walls in a magnetic racetrack memory. The memory may comprise a magnetic domain wall shift register. The injection of the domain wall may be based on an electrical control of surface anisotropy at one or more ferromagnetic metal/dielectric interfaces. Power dissipation may be minimized using one or more techniques described herein. In some embodiments, local anisotropy in a nanowire may be modulated via an electric field. Use of the electric field for write operations may reduce a write coercive field threshold when combined with an Oersted field, or the critical current when combined with a spin torque write technique.

Referring to FIG. 1, a schematic diagram is shown for an exemplary magnetic domain wall shift register memory device 100. The device 100 is shown in FIG. 1 as including a magnetic nanowire 1. The nanowire 1 may correspond to a ferromagnetic material. In some embodiments, the nanowire 1 may be composed of one or more materials or elements, such as for example cobalt, iron, etc.

Domain wall motion may be induced via, e.g., imposition of a charge current across the length of the nanowire 1 and/or driving a current through the nanowire. The device 100 may include a write line for the generation of an Oersted field, in order to write a magnetic domain.

The device 100 may include a nonmagnetic metal top electrode 3 and a dielectric layer 4 in contact with the nanowire 1. In some embodiments, the dielectric layer may have a thickness of approximately 1-10 nanometers. Application of an electric field across the combination of the nanowire 1, the dielectric layer 4, and the electrode 3 may change a carrier concentration, which in turn may contribute to the surface anisotropy of the nanowire 1.

The surface anisotropy contribution may be modulated by applying a bias between the nanowire 1 and the nonmagnetic top electrode 3, thereby modulating the threshold switching field, and hence the threshold current in an Oersted write element 2. The element 2 may be a copper wire carrying an electrical current, which generates an Oersted field. The direction and strength of the Oersted field can be adjusted by varying the sign and the amplitude of the current in portion 2. The element 2 can provide for a preferred magnetization direction with respect to the nanowire 1 when the element 2 is adjacent to the nanowire 1.

A tunnel junction 5 may be placed at different locations along the nanowire 1 and may be used to read out the magnetic state of the nanowire 1. Such a magnetic tunnel junction may be comprised of a dielectric layer used as a barrier (in the 0.5 nm-3 nm thickness range) such as Al2O3, HfO2, TiO2, and MgO and a fixed layer or reference layer comprised of a ferromagnetic layer with an antiferromagnetic pining layer such as FeMn or IrMn or a synthetic antiferromagnet, the free layer of the magnetic tunnel junction is comprised of portion 1 namely the ferromagnetic nanowire. A synthetic antiferromagnet used as a reference layer in the magnetic tunnel junction may be comprised of two ferromagnetic layers each comprised of Co/Pt or Co/Ni multilayers coupled antiferromagnetically via a thin Ru or Ir spacer. The magnetic domains may be moved within the nanowire 1 via application of a current in the nanowire 1.

Figure 2:
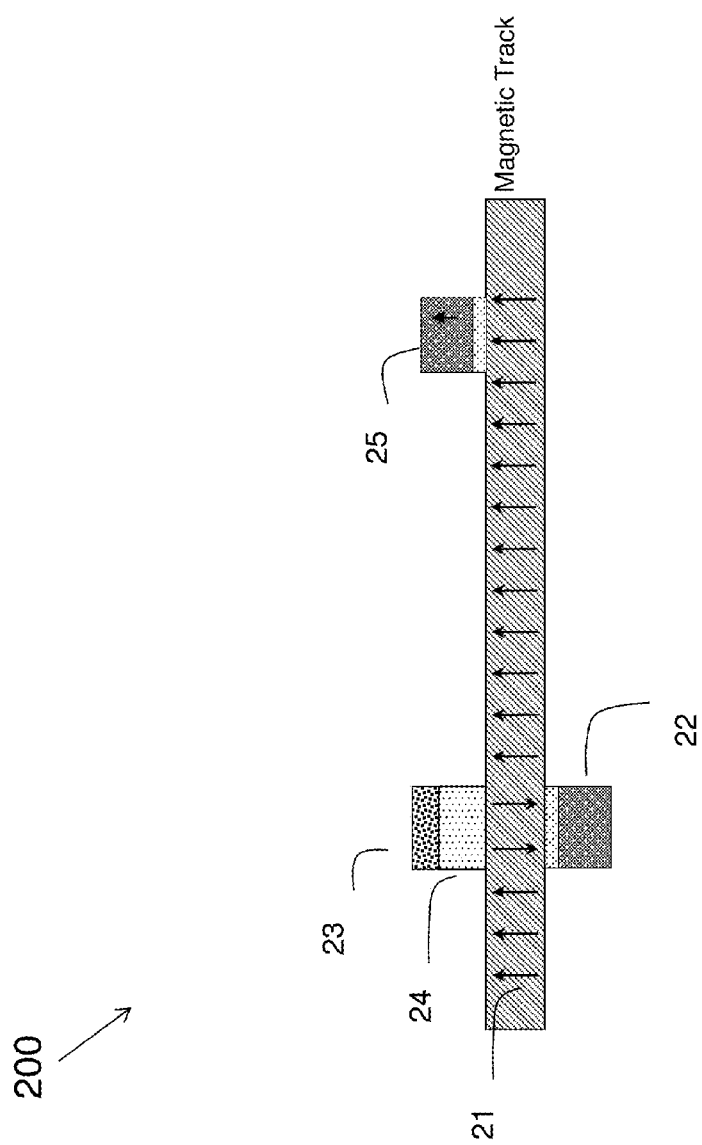
FIG. 2 is a schematic diagram for an exemplary magnetic domain wall shift register memory device.

Turning now to FIG. 2, a schematic diagram is shown for an exemplary magnetic domain wall shift register memory device 200. The device 200 is shown in FIG. 2 as including a magnetic nanowire 21. Domain wall motion may be induced via, e.g., imposition of a charge current across or electrical current through the length of the nanowire 21. A tunnel junction from which a spin polarized-current is injected from a magnetic electrode to the nanowire 21 may be used so as to induce current-induced spin torque transfer switching in the nanowire 21 for the generation of a magnetic domain 22. The device 200 may include a nonmagnetic metal top electrode 23 and a dielectric layer 24 in contact with the nanowire 21 contributing to the surface anisotropy of the nanowire 21. The surface anisotropy contribution may be modulated by applying a bias between the nanowire 21 and the nonmagnetic top electrode 23, thereby modulating the threshold switching currents necessary to induce a magnetic domain wall via spin torque switching from the magnetic tunnel junction 22. A tunnel junction may be placed at different locations along the nanowire 21 and may be used to read out the magnetic state 25 of the nanowire 21.

Figure 3:
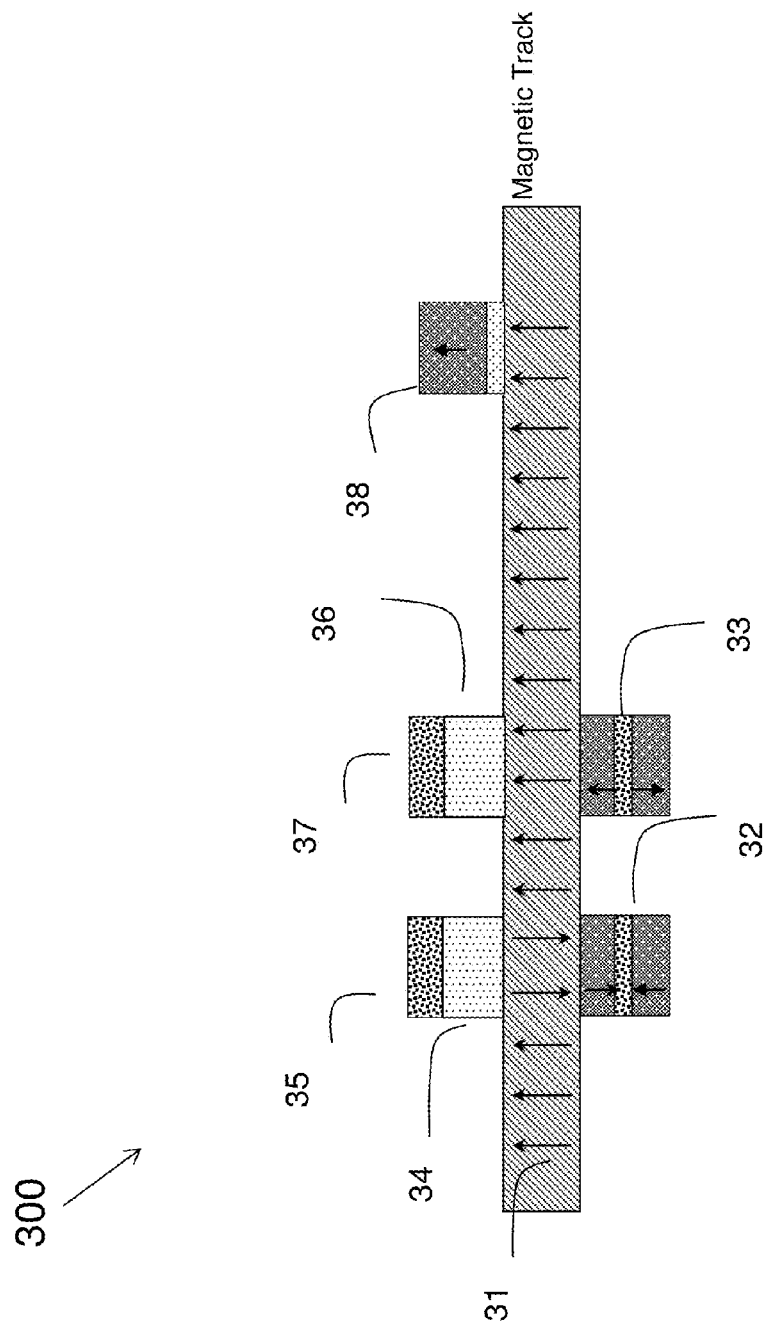
FIG. 3 is a schematic diagram for an exemplary magnetic domain wall shift register memory device.

Turning now to FIG. 3, a schematic diagram is shown for an exemplary magnetic domain wall shift register memory device 300. The device 300 may correspond to a variation on the device 100. The device 300 may include a magnetic nanowire racetrack 31, two magnetic structures comprising a metallic antiferromagnetic layer and/or a synthetic antiferromagnet 32 and 33 placed along the nanowire 31, non-magnetic metal structures 34 and 36 and dielectric structures 35 and 37 forming a gate, and a magnetic tunnel junction 38 for readout. The synthetic antiferromagnet may be comprised of two ferromagnetic layers each comprised of Co/Pt or Co/Ni multilayers coupled antiferromagnetically via a thin Ru or Ir spacer. The gate may be in direct contact with the nanowire 31 and adjacent to structures 32 and 33. The structures 32 and 33 may be set so that their respective interfaces with the nanowire 31 are magnetized towards opposite directions. The gates (34, 35 and 36, 37) along with structures 32 and 33 may provide an electrical control of the magnetic state of the nanowire 31 with a first gate (e.g., 34, 35) allowing a write operation by setting the magnetization for the nanowire 31 in a first direction and a second gate (e.g., 36, 37) being used for erase operations by setting the nanowire 31 magnetization in a second direction (e.g., in a direction opposite to the first direction). The interface of the antiferromagnetic element/structures 32 and 33 with the nanowire 31 may be optimized so as to have a coercive field of the nanowire 31 larger than an offset field due to exchange coupling. By applying an electric field to a metal dielectric structure (e.g., 35 and/or 37) a change the carrier concentration at the metal dielectric interface may be induced. The local surface anisotropy of the nanowire 31 may be modulated by the same technique and a variation of the coercive field of the nanowire 31 along a direction aligned with the direction of the local anisotropy, which may be aligned or perpendicular with an axis of the nanowire 31, may be obtained.

Figure 4:
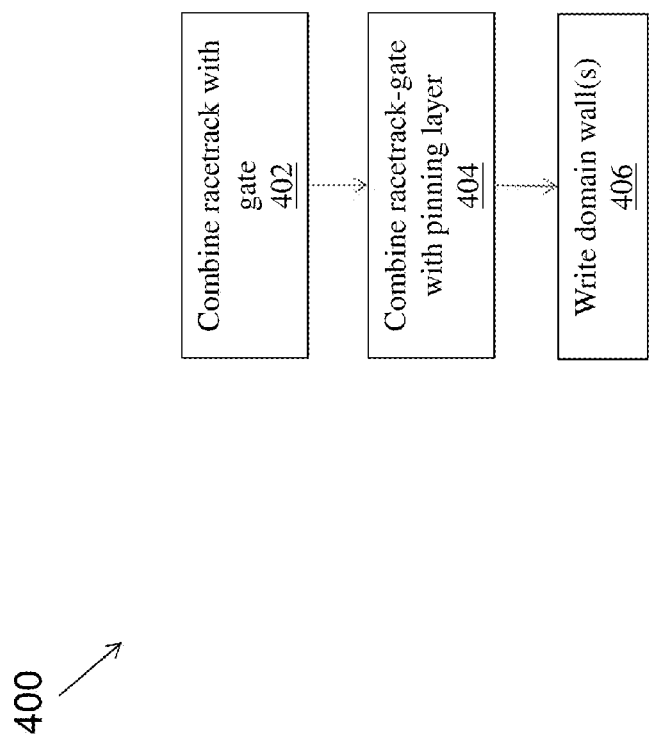
FIG. 4 is a flow chart of an exemplary method of forming a magnetic domain wall shift register memory device, in accordance with another embodiment.

Turning now to FIG. 4, a flow chart of an exemplary method 400 in accordance with one or more embodiments is shown. The method 400 may be used to fabricate and use one or more devices, such as the devices 100, 200, and 300 described herein.

In block 402, a racetrack may be combined with a gate. The combination of the racetrack and gate may be used to manipulate or control a surface anisotropy.

In block 404, the racetrack-gate combination may be combined with a pinning layer (e.g., element 2 of FIG. 1). The pinning layer may be used to establish a magnetization direction with respect to a nanowire associated with the racetrack.

In block 406, one or more domain walls may be written. For example, such writing may occur via the use of an applied electric field in combination with a spin torque element or an Oersted field.

The method 400 is illustrative. In some embodiments, one or more of the blocks (or portions thereof) may be optional. In some embodiments, one or more blocks or operations not shown may be included. In some embodiments, the blocks or operations may execute in an order or sequence different from what is shown in FIG. 4.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

As will be appreciated by one skilled in the art, embodiments may be implemented as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable medium(s) may be utilized, such as one or more non-transitory computer readable mediums. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific example (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the steps may be performed in a differing order or steps may be added, deleted or modified. All of these variations are considered a part of the disclosure.

It will be understood that those skilled in the art, both now and in the future, may make various improvements and enhancements which fall within the scope of the claims which follow.

What is claimed is:

1. A method for injecting domain walls in a magnetic racetrack memory comprising:
    coupling a racetrack comprising a nanowire with a gate in order to manipulate an anisotropy associated with the nanowire; and
    coupling the racetrack and gate with a pinning layer configured to establish a magnetization direction in the nanowire;
    wherein the pinning layer comprises antiferromagnetic material;
    wherein the gate comprises a nonmagnetic metal electrode adjacent to a dielectric layer;
    wherein the pinning layer and the gate are disposed on opposite sides of the nanowire, such that the nanowire is sandwiched in between the pinning layer and the gate.

2. The method of claim 1, wherein the nanowire comprises ferromagnetic material;
    wherein the gate is disposed on a first surface of the nanowire;
    wherein the pinning layer is not formed inside of the nanowire and is disposed on a second surface of the nanowire, the first surface opposing the second surface across the nanowire.

3. The method of claim 1, further comprising:
    applying an electric field across the nanowire and the gate to write a magnetic domain.

4. The method of claim 3, wherein the magnetic domain is written based on an application of an Oersted field.

5. The method of claim 3, wherein the magnetic domain is written based on an application of a spin torque write technique.

6. The method of claim 1, further comprising:
    applying a current to the nanowire to readout a magnetic domain at a tunnel junction.

7. A computer program product for injecting domain walls in a magnetic racetrack memory, the computer program product comprising a non-transitory computer readable storage medium having program code embodied therewith, the program code executable by a device to:
    couple a racetrack comprising a nanowire with a gate in order to manipulate an anisotropy associated with the nanowire; and
    couple the racetrack and gate with a pinning layer configured to establish a magnetization direction in the nanowire;
    wherein the pinning layer comprises antiferromagnetic material;
    wherein the gate comprises a nonmagnetic metal electrode adjacent to a dielectric layer;
    wherein the pinning layer and the gate are disposed on opposite sides of the nanowire, such that the nanowire is sandwiched in between the pinning layer and the gate.

8. The computer program product of claim 7, wherein the program code is executable by the device to:
    apply an electric field across the nanowire and the gate to write a magnetic domain.

9. The computer program product of claim 8, wherein the magnetic domain is written based on an application of an Oersted field.

10. The computer program product of claim 8, wherein the magnetic domain is written based on an application of a spin torque write technique.

11. The computer program product of claim 7, wherein the program code is executable by the device to:
    apply a current to the nanowire to readout a magnetic domain at a tunnel junction.

12. The computer program product of claim 7, wherein the nanowire comprises ferromagnetic material.

13. A magnetic domain wall shift register memory comprising:
    a magnetic nanowire;
    a dielectric layer configured to provide a surface anisotropy contribution to the magnetic nanowire;
    at least one antiferromagnet configured to induce an exchange bias locally on the magnetic nanowire, wherein the at least one antiferromagnet is a pinning layer;
    a tunnel junction configured to provide a readout of a magnetic domain; and
    a gate disposed on the magnetic nanowire;
    wherein the gate comprises a nonmagnetic metal electrode adjacent to the dielectric layer;

wherein the pinning layer and the gate are disposed on opposite sides of the magnetic nanowire, such that the magnetic nanowire is sandwiched in between the pinning layer and the gate.

14. The memory of claim 13, wherein the at least one antiferromagnet comprises a synthetic antiferromagnet.

15. The memory of claim 13, further comprising metal contacts configured to contact both ends of the nanowire to shift magnetic domains laterally.

16. The memory of claim 13, wherein an electric field is applied across the magnetic nanowire and the dielectric layer to write the magnetic domain.

17. The memory of claim 16, wherein the magnetic domain is written based on an application of an Oersted field.

18. The memory of claim 16, wherein the magnetic domain is written based on an application of a spin torque write technique.

* * * * *